(12) United States Patent
Nishino et al.

(10) Patent No.: US 6,995,036 B2
(45) Date of Patent: Feb. 7, 2006

(54) PRODUCTION METHOD OF α-SIC WAFER

(75) Inventors: Shigehiro Nishino, Kyoto (JP); Kazutoshi Murata, Tamano (JP); Yoshiharu Chinone, Tokyo (JP)

(73) Assignee: Mitsui Engineering & Shipbuilding Co., Ltd., Tokyo (JP)

( * ) Notice: Subject to any disclaimer, the term of this patent is extended or adjusted under 35 U.S.C. 154(b) by 131 days.

(21) Appl. No.: 10/478,649

(22) PCT Filed: May 24, 2002

(86) PCT No.: PCT/JP02/05040

§ 371 (c)(1),
(2), (4) Date: Jan. 23, 2004

(87) PCT Pub. No.: WO02/097174

PCT Pub. Date: Dec. 5, 2002

(65) Prior Publication Data
US 2004/0241343 A1 Dec. 2, 2004

(30) Foreign Application Priority Data
May 25, 2001 (JP) .............................. 2001-157668

(51) Int. Cl.
*H01L 21/00* (2006.01)

(52) U.S. Cl. .................. 438/105; 257/77; 117/200

(58) Field of Classification Search ............... 117/104, 117/200; 257/77, 914; 438/105, 931
See application file for complete search history.

(56) References Cited

U.S. PATENT DOCUMENTS 6,660,084 B1 * 12/2003 Shiomi et al. .............. 117/104
6,786,969 B2 * 9/2004 Kondo et al. .............. 117/200

* cited by examiner

*Primary Examiner*—David Nelms
*Assistant Examiner*—Calvin Lee
(74) *Attorney, Agent, or Firm*—Oliff & Berridge, PLC

(57) ABSTRACT

The present invention has its object to make it possible to produce an α-SiC wafer with stability and good reproducibility at low cost without using a seed crystal substrate that is expensive and less available. In each of crucibles 11a, 11b, 11c, and so on, a β-SiC substrate 19 and an SiC raw material 17 are placed to face each other in close proximity. These crucibles are stacked in layers, and placed inside a radiation tube 40. The radiation tube 40 is heated by an induction heating coil 23, radiates radiation heat, and uniformly heats the crucibles 11a, 11b, 11c and so on. The SiC raw material in each of the crucibles is sublimated and recrystallized on a surface of the β-SiC substrate 19.

6 Claims, 6 Drawing Sheets

PRODUCTION METHOD OF α-SiC WAFER

TECHNICAL FIELD

The present invention relates to a production method of an α-SiC wafer, and particularly, relates to a production method of an α-SiC wafer capable of industrially producing high-quality α-SiC wafers with large areas, with stability at low cost.

BACKGROUND ART

Since SiC is thermally and chemically strong, and has good resistance to radiation, its commercialization as a device that can be used in harsh environments is expected. Moreover, SiC has a wide band gap, and it is easy to perform the control of p-type and n-type by doping an impurity, therefore making it useful as a visible light-emitting device material.

Though SiC as described above is a potential semiconductor material, its marketability is not sufficiently grown. One of the causes of this is the fact that crystal growth of SiC is difficult and production technique of a wafer with a large area is not established.

As a production method of crystal α-SiC, known conventionally are (1) Achison method, (2) a vapor epitaxial method, (3) a sublimation method, and (4) an improved sublimation method. In the Achison method cited as (1), a mixture of a silica stone and coke is heated at 2300° C. or more so that the crystal is deposited. The vapor epitaxial method cited as (2) is a CVD (Chemical Vapor Deposition) method, in which epitaxial growth is made on an α-SiC substrate in a temperature range of 1500° C. to 1800° C. The sublimation method of (3) is a method for sublimating SiC powder as a raw material in a graphite crucible and is deposited on a low temperature portion inside the crucible. Furthermore, the improved sublimation method of (4) is a method of placing an SiC substrate on a low temperature portion at an upper portion of the graphite crucible, and crystal SiC is grown on this substrate under Ar atmosphere.

As a method of producing the SiC wafer, the improved sublimation method of (4) is widely adopted for the reason of the SiC growth rate, the quality of the growth layer and the like.

However, in order to grow a crystal α-SiC with a large area with use of the above-described improved sublimation method, it is necessary to repeat growth of SiC with use of a small seed crystal made by the aforementioned Achison method to gradually grow it to the large area. This process requires tremendous time. Consequently, a production method of the α-SiC capable of producing a large amount with fewer process steps is desired. Moreover, machining the grown bulk SiC into a wafer shape requires cutting of SiC with high hardness by means of a diamond cutting grind stone and the like. This process makes it possible to obtain a single crystal of high quality, but it requires tremendous production cost.

The present invention has its object to provide the production method of an α-SiC wafer which solves the above-described disadvantages, and can produce a crystal α-SiC with stability and good reproducibility at low cost without using an expensive and hard-to-find seed crystal substrate.

DISCLOSURE OF THE INVENTION

In order to attain the above-described object, a production method of an α-SiC wafer according to the present invention is a production method of an α-SiC wafer in a method of growing an α-SiC crystal on a substrate by an SiC powder sublimation and recrystallization method, and characterized by comprising: setting a β-SiC crystal produced by a CVD method as the substrate and setting a crucible, in which the substrate and an SiC powder raw material are placed to be close to each other, as one unit; stacking a plurality of the units in layers and placing them inside a radiation tube; heating the radiation tube by an induction heating coil to uniformly heat-treat the multilayer unit inside the tube and thereby growing α-SiC phases on a plurality of substrates up to thickness close to product thickness; and thereafter, removing part or an entire of the aforementioned substrates to thereby produce the α-SiC wafers. In this situation, β-SiC may be either a single crystal, or a polycrystal.

A production method of an α-SiC wafer according to the present invention is a production method of an α-SiC wafer in a method of growing an α-SiC crystal on a substrate by an SiC powder sublimation and recrystallization method, and is characterized by comprising: setting a β-SiC crystal produced by a CVD method as the substrate and setting a crucible, in which the substrate and an SiC powder raw material are placed to be close to each other, as one unit; stacking a plurality of the units in layers and placing them inside an outer crucible; heating the aforementioned outer crucible surrounding a plurality of the aforementioned units stacked in layers by an induction heating coil to uniformly heat-treat the multilayer unit inside the outer crucible, and thereby growing α-SiC phases on a plurality of substrates up to thickness close to product thickness; and thereafter, removing part or an entire of the aforementioned substrates to thereby produce the α-SiC wafers.

Further, a production method of an α-SiC wafer according to the present invention is a production method of an α-SiC wafer in a method of growing an α-SiC crystal on a substrate by an SiC powder sublimation and recrystallization method, and is characterized by comprising: setting a β-SiC crystal produced by a CVD method as the substrate and setting a crucible, in which the substrate and an SiC powder raw material are placed to be close to each other, as one unit; inserting magnetic shield rings in a top and bottom periphery portions of a plurality of units stacked in layers; heat-treating the multilayer unit uniformly so that magnetic flux by an induction heating coil does not concentrate on the top and bottom periphery portions of a plurality of units, and thereby growing α-SiC phases on a plurality of substrates up to thickness close to product thickness; and thereafter, removing part or an entire of the aforementioned substrates to thereby produce the α-SiC wafers.

After growing α-SiC phase on the aforementioned substrate to be a little thicker than final thickness of the wafer, by removing part or the entire of the aforementioned substrates, the wafers of the α-SiC phase can be produced without cutting grown bulk layers.

In the above-described production method, the production method of the α-SiC wafer is carried out as follows. First, the substrate used when SiC is grown is as follows.

1) The substrate shall be produced by the CVD method.
2) The substrate shall be a single crystal or a polycrystalline substrate composed of β-SiC.

The single crystal β-SiC is produced by making heteroepitaxial growth on an Si wafer. An Si wafer with a large diameter is sold on market and production of a single crystal β-SiC with a large diameter is theoretically possible. Meanwhile, a polycrystal β-SiC with a large diameter produced by the CVD method is sold on the market. They are composed of a metastable phase β-SiC of a crystal system 3C. With them as substrates, film forming of α-SiC is performed by the sublimation and recrystallization method. The thickness to which it is grown is about 500 μm. After the growth, a part or the entire of the substrate is ground and removed, and thereby the α-SiC wafer can be obtained. However, the substrate does not necessarily have to be removed completely.

In the production method of a number of wafers, the wafers are produced by placing a number of units each with SiC raw material powder and a substrate. In this situation, the distance between the raw material and the substrate is 1 mm to 20 mm. The height of one unit composed of the raw material and the substrate is 5 mm to 25 mm, and by stacking them in layers, a number of wafers can be produced by one time of heat treatment for sublimation.

Thus, the α-SiC film is grown on the polycrystalline β-SiC substrate. Generally in the sublimation and recrystallization method, the substrate temperature becomes 2000° C. or more, and therefore the α-SiC phase is thermodynamically more stable than the β-SiC phase. Moreover, not only the grown layer but also the substrate surface is considered to be transformed.

BEST MODE FOR CARRYING OUT THE INVENTION

Hereinafter, a preferred embodiment of a production method of an α-SiC wafer according to the present invention will be explained in detail with reference to the accompanying drawings.

Figure 1:
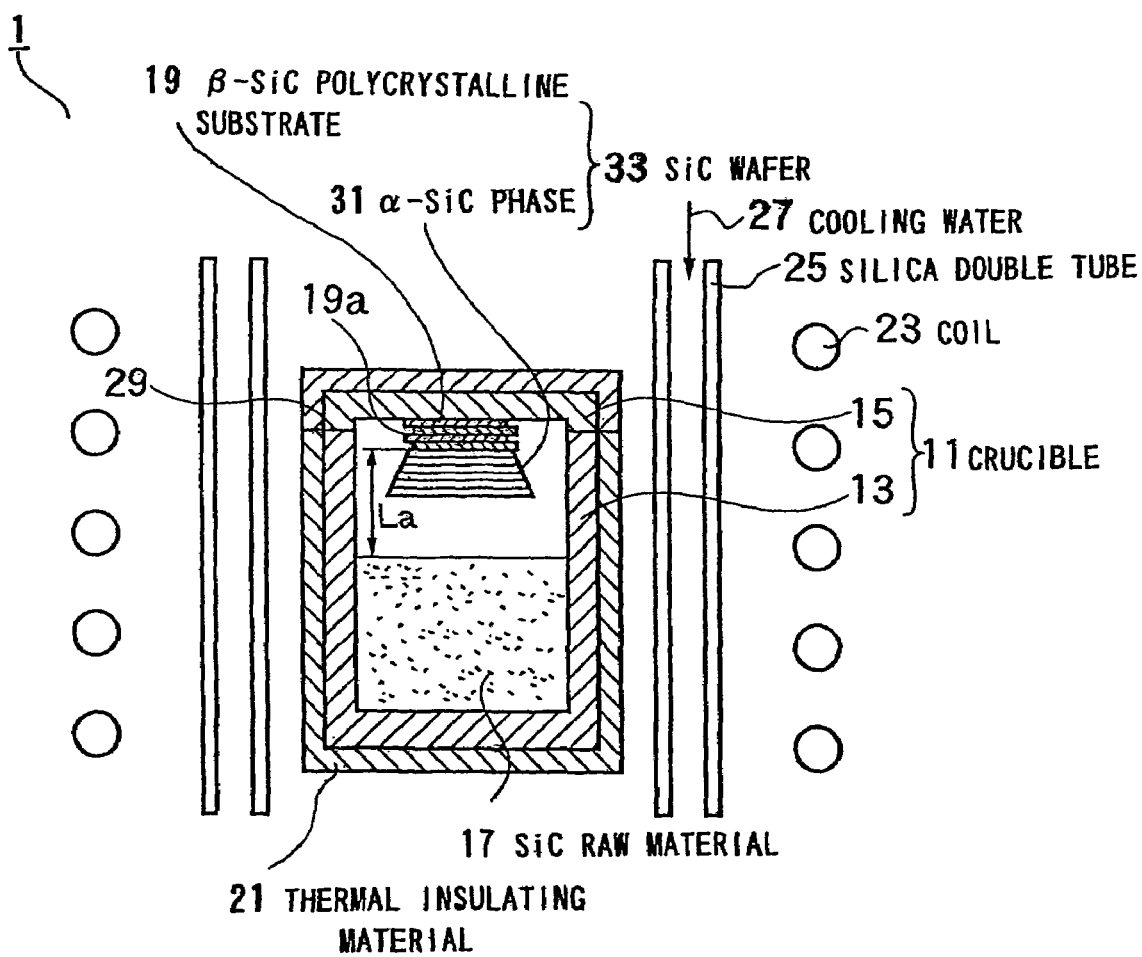
FIG. 1 is a sectional side view of an α-SiC wafer production apparatus for carrying out a production method according to a first embodiment of the present invention.

FIG. 1 is a sectional side view of the α-SiC wafer production apparatus 1 according to the embodiment of the present invention. In FIG. 1, a graphite crucible 11 is placed at a center part. The graphite crucible 11 is formed by a crucible main body 13 and a lid 15. An SiC raw material 17 is housed in the crucible main body 13. A β-SiC substrate 19 is attached to the lid 15.

An outer circumference of the graphite crucible 11 is wrapped with a thermal insulating material 21 made of a carbon material. The graphite crucible 11 is set at a high-frequency heating furnace not shown. In the high-frequency heating furnace, for example, a high-frequency coil (high-frequency heating coil) 23 is placed outside and in an inside thereof, a silica double tube 25 composed of a hollow double tube made of a silica material is placed. Cooling water 27 is fed in an inner part of the silica double tube 25. The high-frequency heating furnace is controlled to have a constant temperature by an output from a high-frequency power unit not shown. Therefore, in the graphite crucible 11, the surface temperature is measured with a pyrometer 29 from clearances of the thermal insulating material 21 at the upper and lower part thereof, and the high-frequency coil 23 is controlled by an output of the high-frequency power unit to maintain a constant temperature.

By heating of this high-frequency heating furnace, the graphite crucible 11 is subjected to induction heating and the SiC raw material 17, then the β-SiC substrate 19 inside the graphite crucible 11 are indirectly heated, and an α-SiC phase 31 deposits on a surface of the β-SiC substrate 19, whereby an SiC 33 is formed.

EXAMPLE 1

The SiC 33 in which α-SiC phase 31 deposits on a bottom surface 19a of the β-SiC substrate 19 was produced under the experimental conditions shown in Table 1 with use of the above-described α-SiC wafer production apparatus 1. At this time, under the conditions shown in Table 1, a distance La between the SiC raw material 17 and the β-SiC substrate 19 was especially set to be 25 mm.

TABLE 1

| | |
|---|---|
| Atmosphere | Ar (argon) 10 Torr |
| Raw material | SiC powder |
| Substrate | β-SiC single crystal wafer |
| | β-SiC polycrystalline wafer |
| Substrate diameter (Da) | 50 mm |
| Raw material temperature | 2400° C. |
| Substrate temperature | 2200° C. |
| Raw material/substrate distance | 25 mm |
| Growth time | 30 min |

Figure 2:
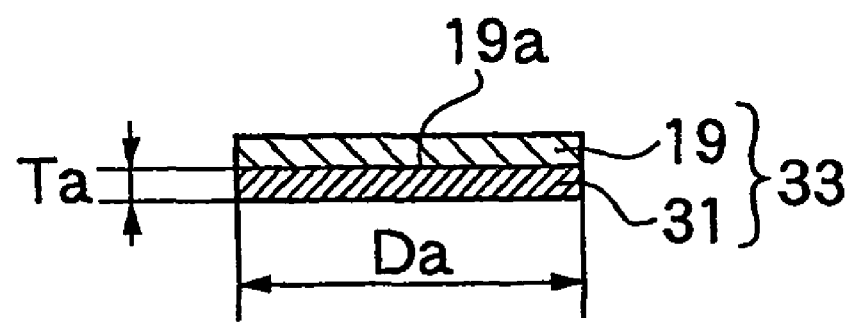
FIG. 2 is a sectional side view of an SiC wafer produced by the method according to the present invention.
Figure 3:
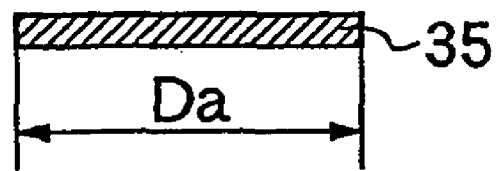
FIG. 3 is a sectional side view of the α-SiC wafer produced by the method according to the present invention.

As a result that the experiment was conducted under the above conditions, the α-SiC phase 31 of 4H crystal with the thickness of Ta=500 μm grew on the β-SiC substrate 19 as shown in FIG. 2. The growth rate was 1.0 mm/h. When the single crystal is used for the substrate, a single crystal of the same size as the substrate diameter was obtained. Meanwhile, when a (111) oriented β-SiC polycrystalline substrate is used, the size of a single crystal grown on the substrate was about 5 mm in diameter. It was confirmed that the crystal system of the obtained crystal was 4H by Raman spectroscopy. Thereafter, the β-SiC substrate 19 was ground and removed, whereby an α-SiC wafer 35 of 4H was obtained as shown in FIG. 3. By producing the α-SiC wafer 35 of 4H with the substrate diameter Da=50 mm while controlling the diameter at will, it is not necessary to cut the high-hardness SiC with a diamond cutting grinder and the like, and since the α-SiC wafer 35 of 4H with the substrate diameter Da=50 mm is thermally and chemically strong and has excellent resistance to radiation, an industrially stable device wafer which can be used under harsh environments can be obtained.

EXAMPLE 2

Figure 4:
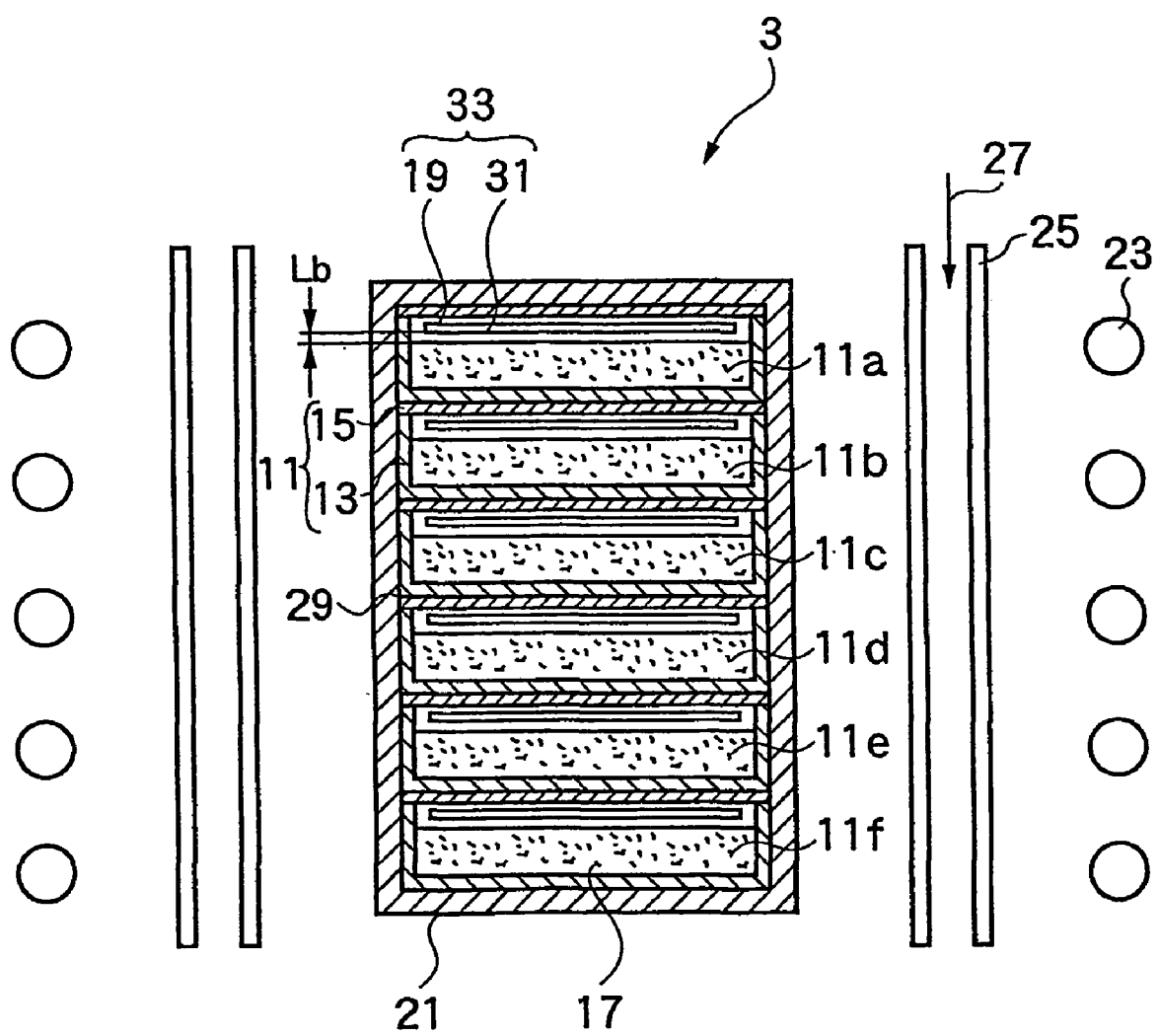
FIG. 4 is a sectional view of an α-SiC wafer multilayer production apparatus for carrying out the production method according to the present invention.

With use of the above-described high-frequency heating furnace and also with use of an α-SiC wafer multistage production apparatus 3 as shown in FIG. 4, the SiC 33 in which the α-SiC phase 31 deposits on the lower surface 19a of the β-SiC substrate 19 was produced under the experimental conditions shown in Table 2, as in Example 1. In the α-SiC wafer multistage apparatus 3 in which the graphite crucible 11 is used and set as a unit as in Example 1, a plurality of the units are stacked on each other in layers as a first unit 11a, a second unit 11b, and, a third unit 11c and so on (in this example, 6 layers), the experiment on growth of an SiC film by the sublimation and recrystallization method was conducted. The experimental conditions are those shown in Table 2, and a distance Lb between the SiC raw material 17 and the β-SiC substrate 19 is especially made 2 mm. Since the distance Lb is short, the temperature difference between the SiC raw material 17 and the β-SiC substrate 19 becomes small, which results in reduction in the growth rate, but a plurality of dense α-SiC phase 31 was obtained.

TABLE 2

| | |
|---|---|
| Atmosphere | Ar 10 Torr |
| Raw material | SiC powder |
| Substrate | CVD-SiC polycrystalline wafer |
| Raw material temperature | 2300° C. |
| Raw material/substrate distance | 2 mm |
| Growth time | 5 hours |

As a result of conducting the experiment under the above conditions, the α-SiC phase 31 of the 4H crystal of the thickness of Ta=500 μm grew on the β-SiC substrate 19 stuck on an inner part of each of the graphite crucible 11, as in Example 1. When a single crystal was used for the substrate, the single crystal of the same size as the substrate diameter was obtained. On the other hand, when a polycrystalline substrate was used, the size of the single crystal that grew on the substrate was about 5 mm in diameter.

As the result of the Raman spectroscopy analysis, it was confirmed to be the 4H single crystal with good crystalline. The crystal polytype, single crystal diameters and deposition rates of the obtained α-SiC phases 31 were the same in the six samples. Thereafter, the β-SiC substrate 19 was ground and removed, whereby the α-SiC wafer 35 of 4H was obtained.

In the above, when the graphite crucibles 11 are stacked in layers to grow the SiC film by the sublimation and recrystallization method, by setting the distance Lb between the SiC raw material 17 and the β-SiC substrate 19 to be 2 mm or more, namely, by making the distance longer to give the temperature difference, the growth time can be shortened, and a larger amount can be produced at lower cost as compared with the conventional method. The production process of growing the SiC film is mainly composed of three steps of (1) processing before the start of growth, (2) growth, and (3) cooling. Of the three steps, each step of (1) and (3) requires about one hour at the minimum, but by processing a large number of pieces with a large number of stages being stacked, the number of man-hours to produce a piece can be greatly reduced, and thus the production efficiency can be improved.

Figure 5:
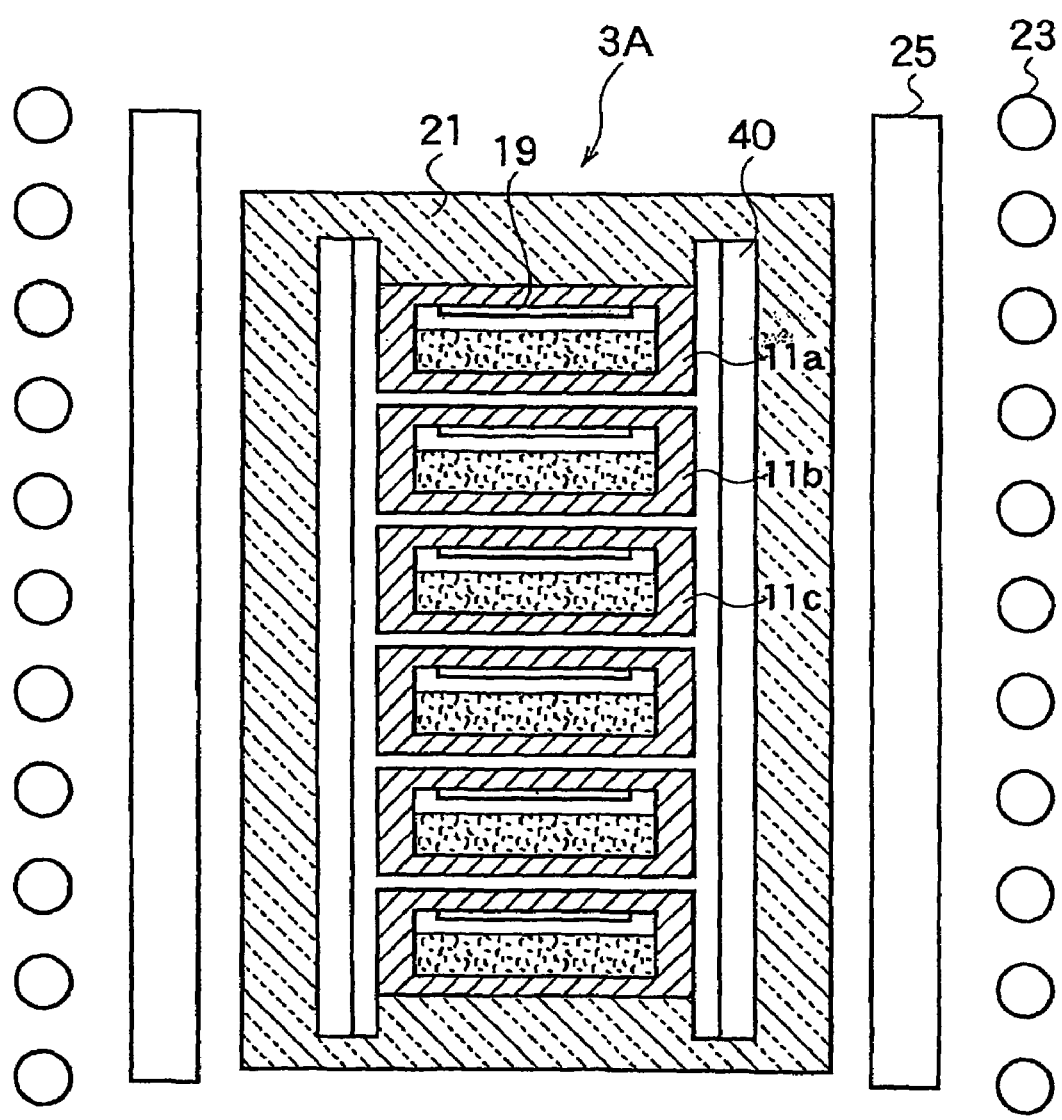
FIG. 5 is a sectional view according to a second embodiment of the α-SiC wafer multilayer production apparatus.
Figure 6:
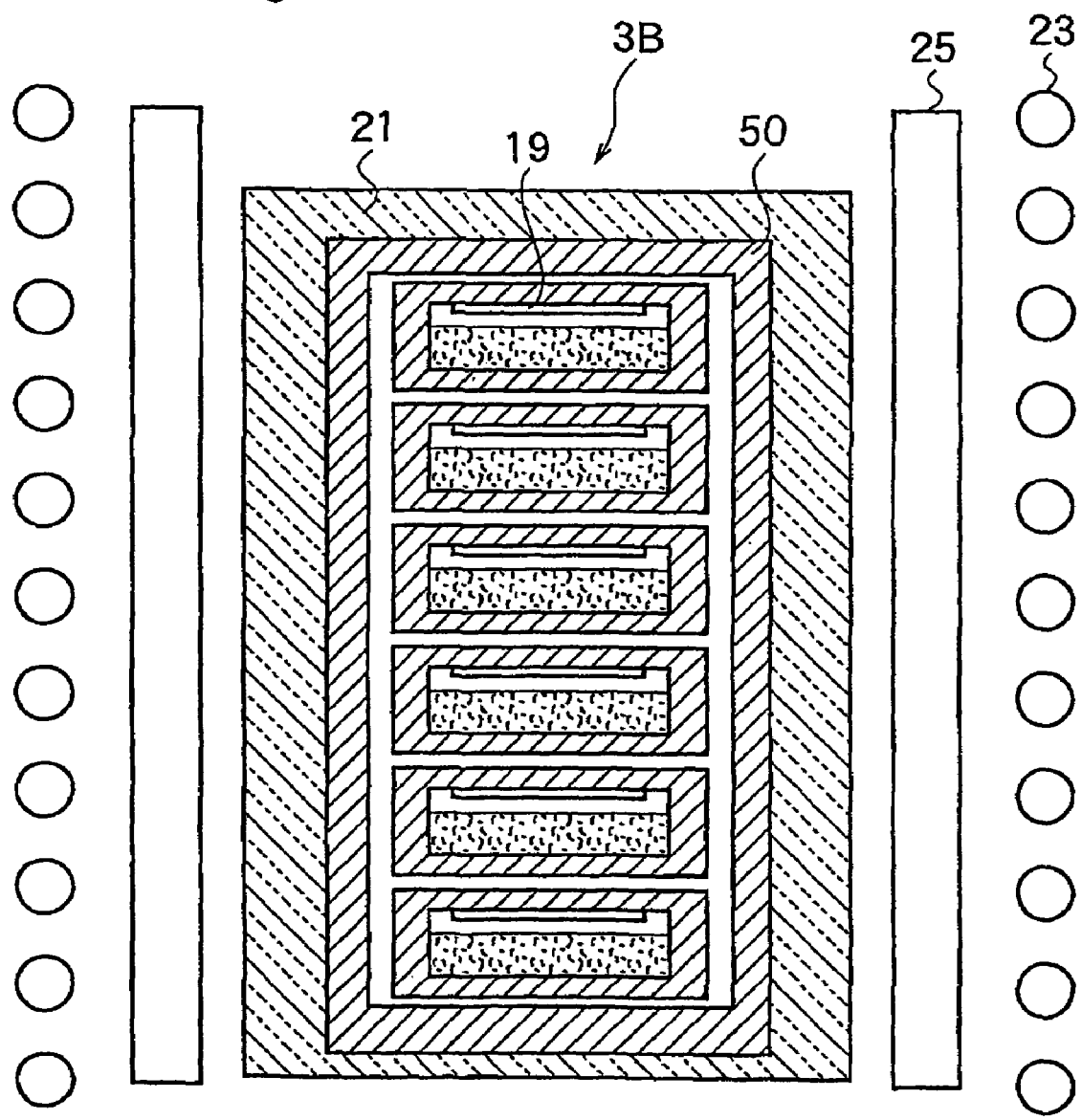
FIG. 6 is a sectional view according to a third embodiment of the α-SiC wafer multilayer production apparatus.
Figure 7:
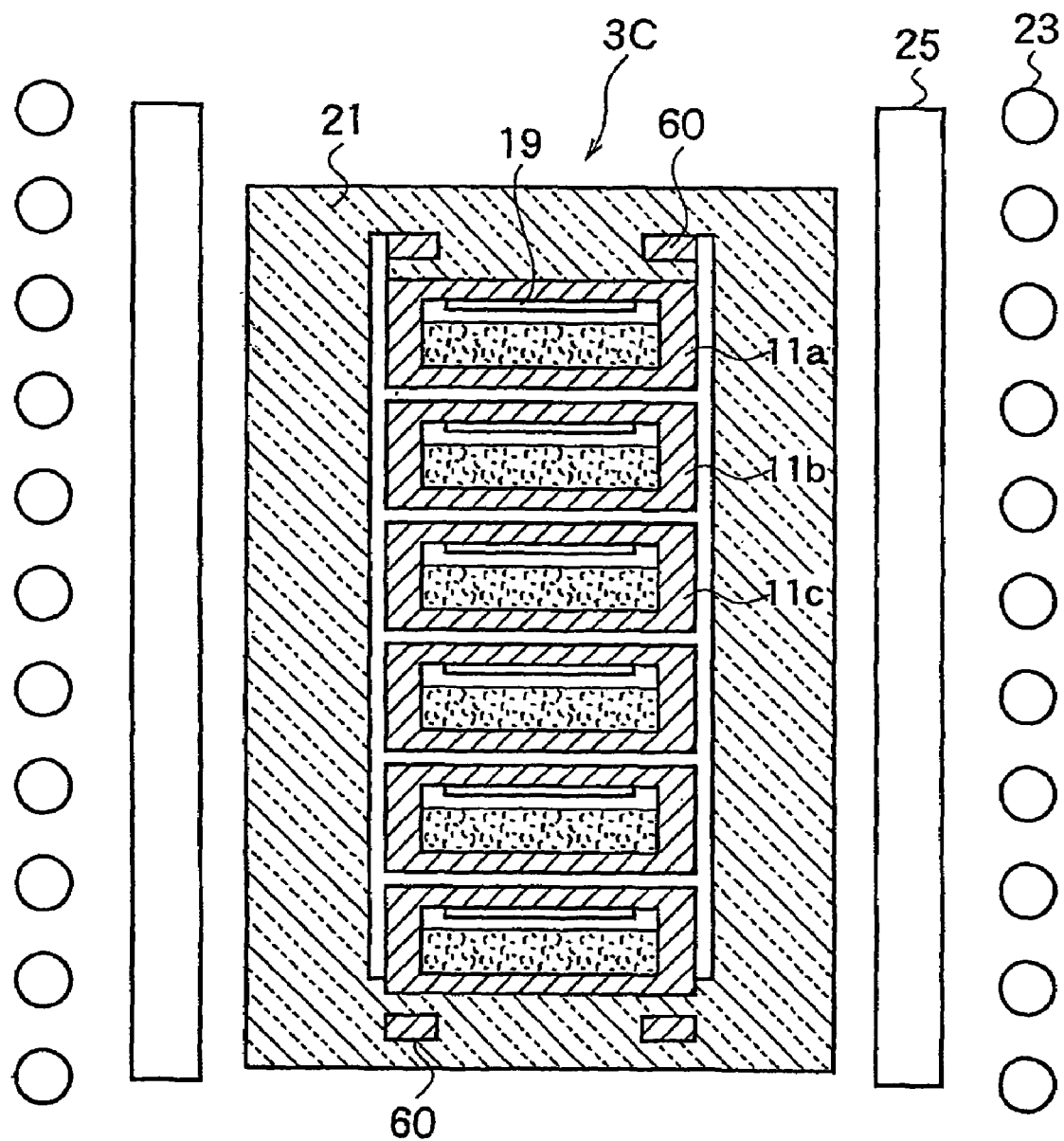
FIG. 7 is a sectional view according to a fourth embodiment of the α-SiC wafer multilayer production apparatus.

When the SiC film is grown by the sublimation and recrystallization method with use of the multilayer unit in which a plurality of units each formed by placing the SiC raw material 17 and the β-SiC substrate 19 in the crucible 11 so that they are situated to face each other in close proximity, it is necessary to uniformly heat the entire multilayer unit composed of the crucible units 11a, 11b, 11c and so on. FIGS. 5 to 7 show α-SiC wafer multistage production apparatuses 3A to 3C to perform uniform heating according to the second to a fourth example are shown.

The apparatus 3A shown in FIG. 5 is a tube shield type with the structure in which a circumference of a multilayer unit 11U (11a, 11b, 11c and so on) is surrounded by a radiation tube 40 composed of graphite. Unless the height of the induction heating coil 23 is sufficiently taken, the magnet flux concentrates on the peripheral portions of a top and bottom surfaces of the multilayer unit 11U and it is locally heated. Therefore, the tube 40 higher than the multilayer unit 11U is produced of graphite, then the multilayer unit 11U is housed therein, and the top and bottom parts are covered with the thermal insulating material 21. The thickness of the tube 40 is made substantially the same as the depth in which an induction current of the induction heating coil 23 enters. Naturally, a space is given between the inner surface of the multilayer unit 11U and the side surface portion of the multilayer unit 11U to make setting so that radiation heating is carried out. As structured as above, the multilayer unit 11U can obtain uniform temperature distribution in a vertical direction as compared with the case without the radiation tube 40.

Next, the apparatus 3B shown in FIG. 6 is provided with an outer crucible 50 made of graphite for housing the entire multilayer unit 11U so that a constant gap is formed, which is constructed as a so-called double crucible type. An entire circumference of the outer crucible 50 is surrounded by the thermal insulating material 21. The heated object by the induction heating coil 23 is set to be the outer crucible 50, so that the entire multilayer unit 11U therein is heated with radiation heat from the outer crucible 50. As compared with the case without the outer crucible 50, vertically uniform temperature distribution of the multilayer unit 11U can be obtained.

Further, an apparatus 3C shown in FIG. 7 is constructed so that a magnetic shield rings 60 are placed to position at the peripheries of the top and bottom surface of the multilayer unit 11U to prevent magnetic flux caused by the induction heating coil 23 from concentrating on the peripheries of the top and bottom surfaces of the multilayer unit 11U and from causing local heating to high temperature. This is a so-called magnetic shield type. In this example, even if the height of the induction heating coil 23 is made close to that of the multilayer unit 11U, magnetic flux concentrates on the magnetic shield ring, and concentration on the corner portions of the multilayer unit 11U is restrained. As a result, heating to the multilayer unit 11U can be made uniform in the vertical direction, production yield is improved, and productivity can be increased.

As explained thus far, according to the embodiments, the β-SiC wafer produced by the CVD method is used, and the α-SiC phase of the thickness of 500 μm or less deposits on its surface, thereby producing the SiC wafer. This SiC wafer is the result of directly producing the α-SiC wafer by grinding and removing a part or the entire of the β-SiC substrate, and it is not necessary to go through the conventional high-cost production process such as producing the α-SiC phase wafer by cutting a bulk layer that is grown until it has large thickness, thus making it possible to produce the α-SiC wafer on an industrial basis at lower cost as compared with the prior art.

Further, the SiC powder raw material and the substrate are placed to be close to each other and are housed in the crucible, and with this as one unit, a plurality of the units are stacked on each other as layers to be heated, thereby making it possible to produce a large amount of α-SiC wafer at low cost and bring it on a production basis.

As described above, according to the present invention, in the method of growing the α-SiC crystal on the substrate by the sublimation and recrystallization method of the SiC powder, with the β-SiC crystal produced by the CVD method as a substrate, and what is made by placing the substrate and the SiC powder raw material to be close to each other is set as one unit, and a number of units are multilayered and heat-treated, whereby the α-SiC phase is grown substantially to the thickness of the product, and thereafter, a part or the entire of the aforementioned substrate is removed to thereby produce the α-SiC wafer, thus making it possible to produce the α-SiC crystal with stability and good reproducibility at low cost without using a seed crystal substrate that is expensive and less available.

INDUSTRIAL AVAILABILITY

An α-SiC wafer, which has a large band gap as a semiconductor device and in which a control of a p-type and an n-type can be easily conducted by doping an impurity, can be produced with good reproducibility at low cost.

The invention claimed is:

1. A production method of an α-SiC wafer in a method of growing an α-SiC crystal on a substrate by an SiC powder sublimation and recrystallization method, comprising the steps of:

setting a β-SiC crystal produced by a CVD method as the substrate and setting a crucible, in which the substrate and an SiC powder raw material are placed to be close to each other, as one unit;

stacking a plurality of the units vertically in layers and placing them inside a radiation tube of a dimension higher than height of the multilayer unit;

heating the radiation tube by an induction heating coil to uniformly heat-treat the multilayer unit inside the tube, and thereby growing α-SiC phases on a plurality of substrates up to thickness close to product thickness; and thereafter, removing part or an entire of the aforementioned substrates to thereby produce the α-SiC wafers.

2. The production method of the α-SiC wafer according to claim 1, wherein:

after the α-SiC phase is grown on a β-SiC crystal produced by a CVD method to be a little thicker than final thickness of the wafer, part or the entire of the aforementioned substrates is removed to produce the wafers of the α-SiC phase without cutting grown bulk layers.

3. A production method of an α-SiC wafer in a method of growing an α-SiC crystal on a substrate by an SiC powder sublimation and recrystallization method, comprising the steps of:

setting a β-SiC crystal produced by a CVD method as the substrate and setting a crucible, in which the substrate and an SiC powder raw material are placed to be close to each other, as one unit;

stacking a plurality of the units in layers and placing them inside an outer crucible;

surrounding an entire circumference of the outer crucible with a heat insulating material;

heating the aforementioned outer crucible surrounding a plurality of the aforementioned units stacked in layers by an induction heating coil to uniformly heat-treat the multilayer unit inside the outer crucible, and thereby growing α-SiC phases on a plurality of substrates up to thickness close to product thickness; and thereafter, removing part or an entire of the aforementioned substrates to thereby produce the α-SiC wafers.

4. The production method of the α-SiC wafer according to claim 3, wherein:

after the α-SiC phase is grown on a β-SiC crystal produced by a CVD method to be a little thicker than final thickness of the wafer, part or the entire of the aforementioned substrates is removed to produce the wafers of the α-SiC phase without cutting grown bulk layers.

5. A production method of an α-SiC wafer in a method of growing an α-SiC crystal on a substrate by an SiC powder sublimation and recrystallization method, comprising the steps of:

setting a β-SiC crystal produced by a CVD method as the substrate and setting a crucible, in which the substrate and an SiC powder raw material are placed to be close to each other, as one unit;

inserting magnetic shield rings in a top and bottom periphery portion of a plurality of units stacked in layers;

heat-treating the multilayer unit uniformly so that magnetic flux by an induction heating coil does not concentrate on the top and bottom periphery portions, and thereby growing α-SiC phases on a plurality of substrates up to thickness close to product thickness; and thereafter, removing part or an entire of the aforementioned substrates to thereby produce the α-SiC wafers.

6. The production method of the α-SiC wafer according to claim 5, wherein:

after the α-SiC phase is grown on a β-SiC crystal produced by a CVD method to be a little thicker than final thickness of the wafer, part or the entire of the aforementioned substrates is removed to produce the wafers of the α-SiC phase without cutting grown bulk layers.

* * * * *